United States Patent

[11] 3,604,107

[72] Inventor John R. Fassett
Irvine, Calif.
[21] Appl. No. 817,129
[22] Filed Apr. 17, 1969
[45] Patented Sept. 14, 1971
[73] Assignee Collins Radio Company
Dallas, Tex.

[54] DOPED OXIDE FIELD EFFECT TRANSISTORS
7 Claims, 8 Drawing Figs.

[52] U.S. Cl. .......................................................... 29/571,
29/578, 148/187
[51] Int. Cl. .......................................................... B01j 17/00,
H01g 13/00
[50] Field of Search ............................................. 29/571,
578; 148/187, 188

[56] References Cited

UNITED STATES PATENTS

| | | | |
|---|---|---|---|
| 3,447,238 | 6/1969 | Heynes et al. ................ | 29/590 |
| 3,475,234 | 10/1928 | Kerwin et al.................. | 29/590 |
| 3,514,844 | 6/1902 | Bower et al................... | 29/571 |

*Primary Examiner*—John F. Campbell
*Assistant Examiner*—W. Tupman
*Attorneys*—Henry K. Woodward and Robert J. Crawford

ABSTRACT: Disclosed is a method of making a field effect transistor with an accurately aligned gate by forming the source and drain regions from a doped layer on the substrate surface. The resulting transistor has reduced internal capacitance and improved speed characteristics.

INVENTOR.
JOHN R. FASSETT

BY Henry K. Woodward
ATTORNEY

DOPED OXIDE FIELD EFFECT TRANSISTORS

This invention relates generally to semiconductor devices and methods of making same, and in particular to an improved method of making a field effect transistor and circuits utilizing field effect transistors.

An object of the invention is an improved field effect transistor.

Another object of the invention is a field effect transistor having reduced internal capacitance and improved speed characteristics.

Still another object of the invention is a field effect transistor having reduced gate to source capacitance and gate to drain capacitance.

Another object of the invention is a method of making field effect transistors with gates accurately aligned with respect to the sources and drains.

Yet another object of the invention is a method of making a field effect transistor having reduced internal capacitance.

Yet another object of this invention is a method of making field effect transistor arrays on a common silicon substrate with reduced capacitive feedthrough, reduced capacitive loading, and reduced voltage feedthrough from one stage to the next, thereby improving the performance of the array and reducing the number of required elements in the array by eliminating the need for split devices.

A feature of the invention is the use of deposited oxides and a gate etching step in forming the diffused source and drain portions of a field effect transistor.

These and other objects and features of the invention will be apparent from the following description and appended claims when taken with the drawing, in which:

Figures 1, 2, 3A, 3B, 3C, 3D, 3E, 3F:
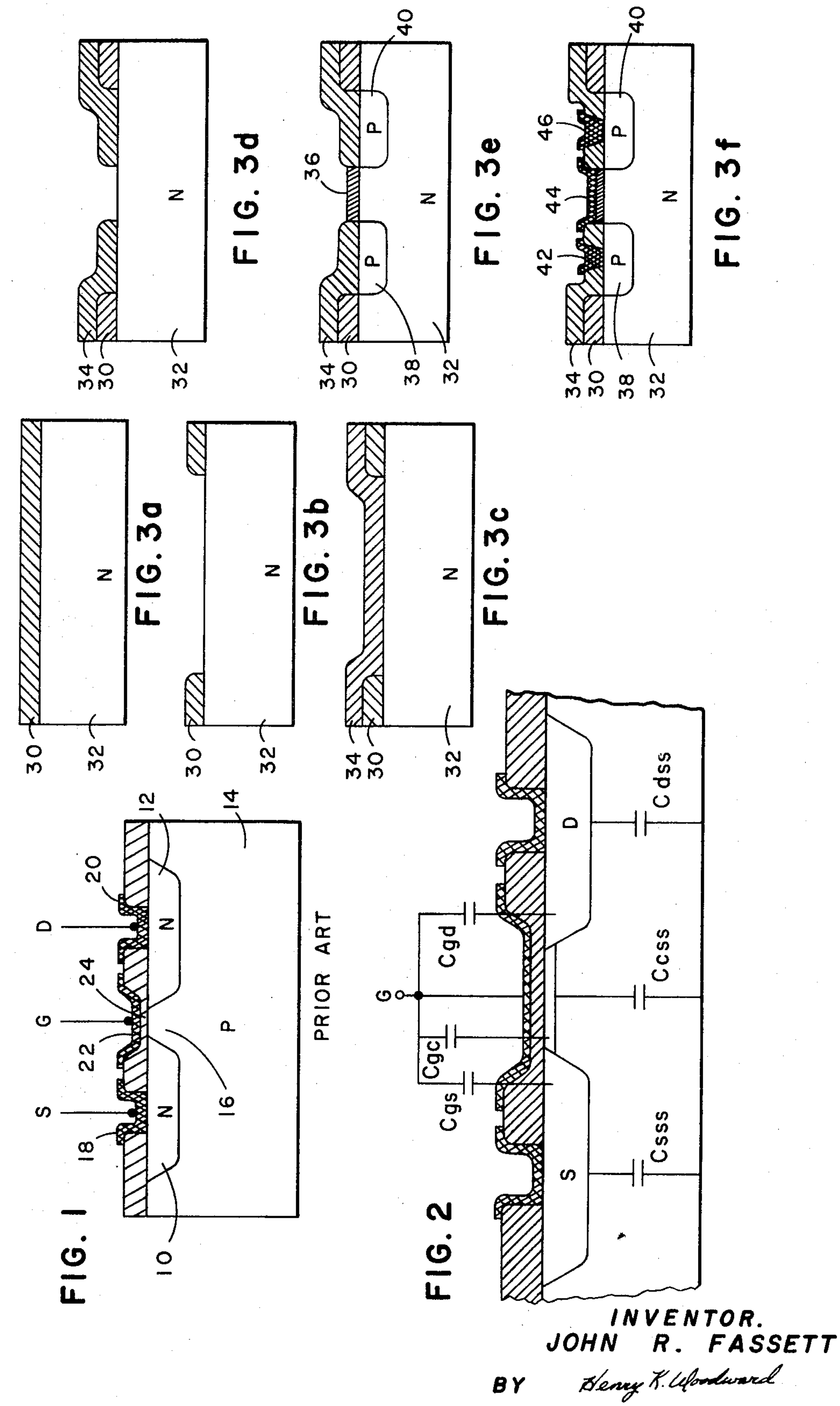
FIG. 1 is a section view of a conventional field effect transistor.
FIG. 2 is a section view of a conventional field effect transistor illustrating the internal capacitances of the transistor; and FIGS. *3a*–*3f* illustrate sequentially the method of making a field effect transistor in accordance with this invention.

Referring now to the drawings, FIG. 1 is a section view of a conventional field effect transistor. While many varieties of field effect transistors are in existence today, including metal-nitride-oxygen silicon (MNOS), metal-alumina-oxide-silicon (MAOS), and silicon-on-sapphire or silicon-on-spinel (SOS), perhaps the most common is the standard metal-oxide-silicon (MOS). Thus, for illustration purposes hereinafter, an MOS field effect transistor will be used, but it will be appreciated that the basic principles are applicable to other field effect devices. Further, the following description relates to a P-channel device, but the teachings are also applicable to N-channel devices.

Referring to FIG. 1, P-type source and drain 10 and 12, respectively, are provided in an N-type silicon substrate 14 with the portion of substrate 14 between the spaced source 10 and drain 12 functioning as the channel 16. Contacts 18 and 20 are made to the source 10 and drain 12, respectively, and contact 22, spaced from channel region 16 by oxide insulation 24, is the gate contact.

Conventionally, the source and drain regions of MOS transistors are made by diffusing impurities from a diffusion furnace atmosphere selectively into a semiconductor substrate through openings in an oxide layer on the substrate. Subsequently, new oxide is grown over the channel region between the source and drain to provide the gate insulation. Since this process utilizes photoresist masking techniques the gate region as defined by the newly grown oxide always overlaps the source and drain regions substantially to compensate for limitations in resolution, errors in mask making, and allowable tolerances for slight inaccuracies in alignment of each mask on the wafer. The overlapping of the gate produces gate to source capacitance and gate to drain capacitance which adversely affect the operation of the device.

The internal capacitance of the MOS transistor is its most serious limitation. Since these internal capacitances must be charged and discharged in device operation the device is limited in maximum frequency of operation. FIG. 2 is a section view of the transistor shown in FIG. 1 with the various internal capacitances illustrated. These include source-to-substrate capacitance ($C_{s1ss}$), channel-to-substrate capacitance ($C_{c1ss}$), drain-to-substrate capacitance ($C_{d1ss}$), gate-to-channel capacitance ($C_{gc}$), gate-to-source capacitance ($C_{gs}$), and gate-to-drain capacitance ($C_{gd}$). The latter two capacitances, due largely to the gate overlapping the source and drain regions, have the greatest effect on device performance.

In accordance with this invention, gate-to-source capacitance and gate-to-drain capacitance is minimized by accurately registering the gate area with respect to the source and drain regions. As will be described with respect to an MOS transistor, this is accomplished through the use of deposited oxides and a gate etching step in forming the source and drain regions.

FIGS. *3a*—*3f* illustrate sequentially the method of making a P-channel, enhancement mode MOS transistor in accordance with the invention. Initially, as shown in FIG. *3a*, a relatively thick (perhaps 10,000 angstroms) silicon oxide layer 30 is thermally grown on an N-type silicon substrate 32. The conductivity of the substrate 32 may be of the order of 5 ohm-centimeter or $10^{15}$ impurities per cubic centimeter.

Next, through photoresist masking techniques, a region of the oxide layer 30 is removed by a conventional chemical etching process, as shown in FIG. *3b*. The etched region, which may be rectangularly shaped, in the oxide layer is large enough to accommodate the source, gate, and drain regions of the MOS transistor to be fabricated or, in general, wherever there is to be a P-region or a gate.

Thereafter, a second oxide layer 34, which is doped with a P-type dopant such as boron, is deposited on the substrate by conventional chemical vapor deposition as shown in FIG. *3c*. Preferably, the chemical vapor deposition is accomplished at a temperature no higher than 500°C. to limit the diffusion of impurities into the semiconductor substrate. The concentration of N-type dopant in the silicon oxide is on the order of $10^{17}$ to $10^{19}$ atoms per cubic centimeter.

In an alternate approach a thin layer of boron oxide glass may be applied to the etched region in the oxide layer 30 prior to the deposition of the second oxide layer 34. The boron oxide deposition may be performed by heating the substrate in the presence of gaseous diborane or liquid boron tribromide. With this approach the second oxide layer need not be doped as the boron oxide glass provides the P-type dopant for subsequently defining the source and drain regions.

In FIG. *3d*, the gate portion for the transistor is defined by removing through chemical etching a portion of the doped oxide layer 34, extending completely across the layer 34. During the etching process the surface of the substrate at the gate region is etched slightly to remove any trace of boron which may have diffused into the substrate.

Thereafter, as shown in FIG. *3e* a thin layer of silicon oxide 36 is thermally grown in the gate region to provide the gate insulation. The new oxide is grown by heating the substrate at a temperature of about 1,100°C. which also is sufficiently high to cause boron which still remains over source and drain regions to diffuse into the substrate 32 and form P-type source and drain regions 38 and 40, respectively. It will be noted that the gate oxide 36 abuts the source 38 and drain 40 but does not substantially overlap the source and drain regions. Thus, by providing accurate registration of the gate to the source and drain regions, the gate-to-source capacitance and gate-to-drain capacitance is minimized. The resulting transistor has improved speed for digital applications and can operate at higher frequencies and with higher grain in linear applications.

The transistor is completed as shown in FIG. *3f* by removing a portion of the oxide layer over the source and drain regions and depositing aluminum contacts 42, 44 and 46 for the source, gate and drain contacts, respectively.

The novel process described herein may be used in fabricating discrete components or in manufacturing integrated circuit arrays. The method may be employed to form N-channel field effect transistors as well as P-channel field transistors, as described herein. Further, while the MOS transistor is the most popular conventional field effect transistor, the principles involved in the invention may be used in fabricating other types of field effect transistors. Thus, various modifications and changes may occur to those skilled in the art without departing from the spirit and scope of the invention.

What is claimed is:

1. The method of making a field effect transistor in a doped semiconductor substrate of a first conductivity type comprising the steps of 1. forming an undoped oxide layer on a surface of said substrate,
2. removing said undoped oxide layer from a first selected portion of said surface,
3. forming a doped oxide layer of a second conductivity type on said undoped oxide layer and on said first selected portion of said surface,
4. removing said doped oxide layer from a second selected portion of said surface within said first selected portion and extending across said first selected portion,
5. forming an undoped oxide layer on the surface of said second selected portion, and concurrently diffusing impurities from said doped oxide layer into said substrate thereby converting regions in said substrate directly beneath said doped oxide layer to the second conductivity type and
6. forming source and drain electrical contacts to said regions and a gate electrical contact on said undoped oxide layer on the surface of said second selected portion.

2. The method of making a field effect transistor as defined by claim 1 wherein said semiconductor material is silicon and said oxide is silicon oxide.

3. The method of making a field effect transistor as defined by claim 2 wherein said semiconductor material is N-type conductivity and said doped oxide is P-type conductivity.

4. The method of making a field effect transistor as defined by claim 3 wherein said semiconductor substrate initially has an N-type dopant concentration of about $10^{15}$ impurities per cubic centimeter and said doped oxide has a dopant concentration of between $10^{17}$ to $10^{19}$ impurities per cubic centimeter.

5. The method of making a field effect transistor in a doped semiconductor substrate of a first conductivity type comprising the steps of 1. forming a first undoped oxide layer on a surface of said substrate,
2. removing said undoped oxide layer from a first selected portion of said surface,
3. forming a thin highly doped layer of a second conductivity type on said first selected portion of said surface,
4. forming a second undoped oxide layer on said thin highly doped layer and on said first undoped oxide layer,
5. removing said second oxide layer and said thin highly doped layer from a second selected portion of said surface within said first selected portion and extending across said first selected portion,
6. forming a third undoped oxide layer on the surface of said second selected portion, and concurrently diffusing impurities from said highly doped surface into said substrate thereby converting regions in said substrate directly beneath said highly doped layer to the second conductivity type, and
7. forming source and drain electrical contacts to said regions and a gate electrode on said third oxide layer.

6. The method of making a field effect transistor as defined by claim 5 wherein said semiconductor material is silicon and said oxide is silicon oxide.

7. The method of making a field effect transistor as defined by claim 6 wherein said semiconductor material is N-type conductivity and said thin highly doped layer comprises boron oxide glass.